(12) United States Patent
Joshi et al.

(10) Patent No.: US 11,113,232 B2
(45) Date of Patent: Sep. 7, 2021

(54) DISAGGREGATED COMPUTER SYSTEM

(71) Applicant: SUPER MICRO COMPUTER, INC., San Jose, CA (US)

(72) Inventors: Vivek Joshi, Sunnyvale, CA (US); Chih-Chieh Chang, Fremont, CA (US); Chang-Hsin Geng, Milpitas, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 0 days.

(21) Appl. No.: 16/172,324

(22) Filed: Oct. 26, 2018

(65) Prior Publication Data

US 2020/0133913 A1 Apr. 30, 2020

(51) Int. Cl.
*G06F 15/78* (2006.01)
*H05K 5/00* (2006.01)
*H05K 7/02* (2006.01)

(52) U.S. Cl.
CPC ...... *G06F 15/7896* (2013.01); *G06F 15/7867* (2013.01); *H05K 5/0065* (2013.01); *H05K 5/0069* (2013.01); *H05K 7/026* (2013.01)

(58) Field of Classification Search
CPC ............ G06F 15/7896; G06F 15/7867; H05K 5/0065; H05K 5/0069; H05K 7/026
See application file for complete search history.

(56) References Cited

U.S. PATENT DOCUMENTS

| | | | |
|---|---|---|---|
| 6,215,727 B1 * | 4/2001 | Parson | G11C 7/1006 365/230.09 |
| 9,432,298 B1 * | 8/2016 | Smith | H04L 49/9057 |
| 2005/0262368 A1 * | 11/2005 | Cherukuri | G06F 1/3209 713/324 |
| 2007/0226596 A1 * | 9/2007 | Safranek | G06F 1/3253 714/781 |
| 2008/0266993 A1 * | 10/2008 | Goldstein | G06F 13/4243 365/223 |
| 2010/0005246 A1 * | 1/2010 | Beers | H04L 67/28 711/146 |
| 2012/0084974 A1 * | 4/2012 | Goldstein | H05K 7/1431 29/825 |
| 2013/0076597 A1 * | 3/2013 | Becze | G06F 3/1438 345/1.3 |
| 2014/0044157 A1 * | 2/2014 | Chang | G06F 15/7842 375/219 |
| 2014/0164669 A1 * | 6/2014 | Coglitore | G06F 13/4022 710/316 |
| 2015/0054654 A1 * | 2/2015 | Albinali | H04W 4/80 340/870.01 |
| 2015/0127983 A1 * | 5/2015 | Trobough | G06F 11/2733 714/30 |

(Continued)

*Primary Examiner* — Henry Tsai
*Assistant Examiner* — Aurangzeb Hassan
(74) *Attorney, Agent, or Firm* — WPAT, P.C.; Anthony King

(57) ABSTRACT

A computer system includes a processor and a memory. The processor is located on a first circuit board having a first connector. The memory is located on a second circuit board having a second connector. The first circuit board and the second board are physically separated from each other but connect to each other through the connector. The processor and the memory are communicated to each other based on a differential signaling scheme.

15 Claims, 3 Drawing Sheets

(56) References Cited

U.S. PATENT DOCUMENTS

2018/0024957 A1\* 1/2018 Nachimuthu ......... G06F 3/0613
                                                711/170
2018/0101214 A1  4/2018 Mahindru et al.
2018/0285192 A1\* 10/2018 Merl ..................... G06F 11/106
2019/0272020 A1\* 9/2019 Woo ..................... G06F 1/1643

\* cited by examiner

DISAGGREGATED COMPUTER SYSTEM

BACKGROUND

1. Technical Field

The present disclosure relates to a disaggregated computer system, and more particularly, to a computer system including disaggregated electronic components.

2. Description of the Related Art

In a conventional computer system, multiple components (e.g., a central processing unit (CPU), a memory, a chipset, peripheral components, power subsystems, and the like) are incorporated on a single motherboard. The CPU and memory almost always sit in their own sockets on the motherboard, and the chipset is almost always glued/soldered to the motherboard, i.e., it usually does not have a socket. In some embodiments, the chipset or I/O connectivity hub maybe integrated into the microprocessor itself. The components communicate with each other through high speed signal traces on the motherboard. However, this configuration increases the time and complexity to replace or upgrade the components in the conventional computer system. In addition, since all the components are placed on a single motherboard, when users intend to upgrade or replace a component in the conventional computer system, they would need to upgrade or replace other components in the computer system as well, which increases the cost for upgrading the computer system. In some scenarios of today, the microprocessor or the memory maybe replaced assuming they share the same socket, but if the socket changes this replacement will necessitate replacing the complete motherboard.

SUMMARY

In accordance with some embodiments of the present disclosure, a computer system includes a processor and a memory. The processor is located on a first circuit board having a first connector. The memory is located on a second circuit board having a second connector. The first circuit board and the second board are separated from each other. The first connector is connected/mated to the second connector. The processor and the memory communicate with each other based on a differential signaling scheme.

In accordance with some embodiments of the present disclosure, a computer system includes a processor and a memory. The processor is located on a first circuit board having a first connector. The memory is located on a second circuit board having a second connector. The first circuit board is separated from the second circuit board. The first connector is connected to the second connector. The processor and the memory communicate with each other via a serial connection.

In accordance with some embodiments of the present disclosure, a computer system includes a processor and a memory. The processor is located on a first circuit board having a first connector. The memory is located on a second circuit board having a second connector. The first circuit board is separated from the second circuit board. The first connector is connected to the second connector. The processor and the memory communicate with each other via a serial connection leveraging differential signaling.

Figure 1:
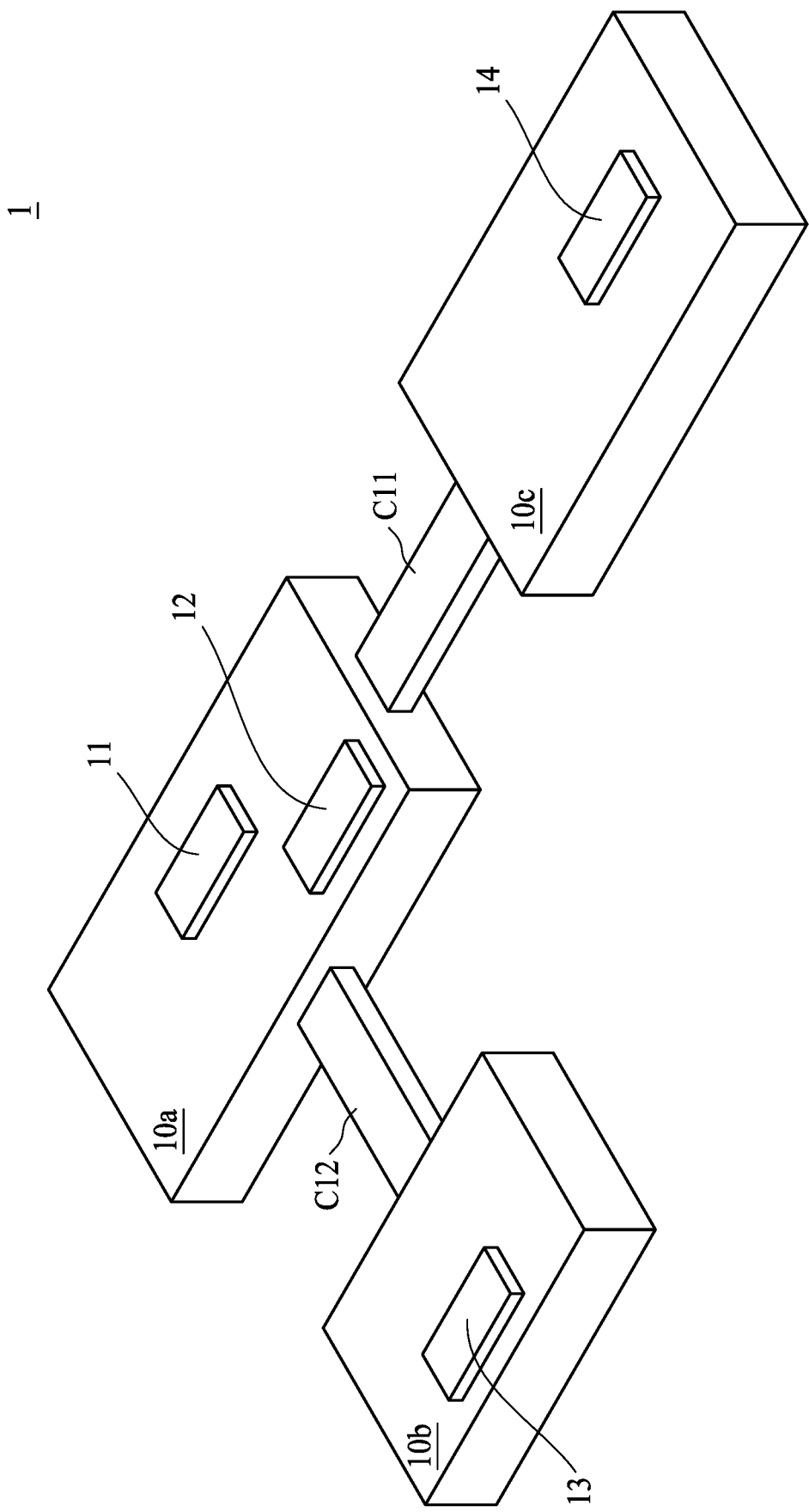
FIG. 1 illustrates a block diagram of a computer system in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

In accordance with some embodiments, a computer system is provided. The computer system includes a processor and a memory. If the processor incorporates all the I/O connectivity options then a companion I/O chip may NOT be required. However, microprocessor used in the datacenter, cloud and other use cases where multiple I/O options maybe required, the I/O hub (a companion chip) is needed to enable a multitude of I/O options. The processor is located on a first circuit board having a connector. The memory is located on a second circuit board having a separate connector. The first circuit board and the second board are physically separate from each other. The first connector connects to the second connector. The processor and the memory may communicate with each other based on a differential signaling scheme, with a point-to-point connection to enable a high speed data link.

The I/O chip or I/O companion chip if needed is placed on a third circuit board. This board (with the I/O chip) is then connected to the board that has the processor on it. The current iteration of microprocessors have a high-speed connection that can be used to connect additional co-processors and/or customized processors (such as using FPGA, ASICs, or SoC) to enable off-loading of critical functions to them. For reference, please see the QAT (Quick Assist Technology) from Intel. The connection between the first circuit board and this board is currently enabled through a commodity high-speed serial differential, point-point bus. The current implementation enables one to use the same board as newer processors are enabled or design a new board to work with the processors as the high-speed link speeds increase with improvements in technology.

FIG. 1 illustrates a block diagram of a computer system 1 in accordance with some embodiments of the present disclosure. In some embodiments, the computer system may be in a data center, a server or any other information technology (IT) systems. The computer system 1 includes a processor 11, a memory 12, a chipset 13 and other electronic components 14.

The processor 11 is located on a circuit board (or motherboard) 10a. For example, the processor 11 is located in a socket on the motherboard 10a. The processor 11 is configured to control the operation of the computer system 1, calculations and logical operations in accordance with computer program instructions. In some embodiments, the processor 11 can be a single-core, dual-core, multi-core, or multithreaded CPU. The processor 11 is coupled to the memory 12, the chipset 13 and the electronic components 14, allowing data to be exchanged there between. In some embodiments, the processor 11 is coupled to the chipset 13 and the electronic components 14 via a suitable serial (e.g., proprietary) connection not limited to but possibly including the Peripheral Component Interconnect Express (PCI-E) link.

The memory 12 is located on the motherboard 10a and coupled to the processor 11 or sometimes to the chipset via a multidrop bus (MDB). Such multi-drop busses, may provide a non-packet or sometimes a packet based signal transmission. In some embodiments, signals or data are transmitted between the memory 12 and the processor 11 based on a full-rail signaling scheme. For example, the signal ranges between ground and a reference voltage. The memory 12 may include dynamic random access memory (DRAM), such as asynchronous dynamic random access memory, synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), double data rate type four synchronous dynamic random access memory (DDR4 SDRAM), non-volatile memory, or any other embodiment used to store data. Furthermore, the memory may also include some other implementations that enable similar functionality that the current DRAM implementations enable. For ex.an embodiment where the transmission between the processor and memory maybe packet based as Intel enabled with the Memory buffer approach.

The chipset 13 is located on a motherboard 10b (or circuit board) and connected to the processor 11 and/or the memory 12 through a connector C11 (e.g., Direct Media Interface (DMI) or any other suitable connections). In some embodiments, the chipset may include I/O Hub or Platform Controller Hub (PCH) and enable connectivity through protocols such as PCI-E, Thunderbolt, Enhanced Serial Peripheral Interface (eSPI), SPI, Low Pin Count (LPC) Bus, System Management Bus (SMBus), High Definition Audio (HD Audio), Local Area Network Port Physical Layer (LAN PHY), Serial Advanced Technology Attachment (SATA), Serial Attached SCSI (SAS), Universal Serial Bus (USB) and the like.

The electronic components 14 are located on a motherboard 10c (or circuit board) and connected to the processor 11 and/or the memory 12 through a connector C12 (e.g., PCI-E or any other suitable connections). In some embodiments, the electronic components 14 may include a network interface controller, a PCI-E controller, a storage device, an accelerator, or any other suitable component for data processing, data caching, and/or communication. In some embodiments where the IO hub/PCH is not required the whole functionality of that subsystem maybe enabled in the processor itself. In that scenario the system will comprise of two board, the CPU board and the memory board.

In accordance with the embodiments in FIG. 1, since the processor 11 and the memory 12 are located on the motherboard 10a separate from the motherboards 10b and 10c on which the chipset 13 and the electronic components 14 are located, the processor 11/memory 12, the chipset 13 and electronic components 14 can be updated or replaced at different times. As compared to a computer system incorporating a processor, a memory, a chipset and other electronic components on a single motherboard, the computer system 1 in FIG. 1 is more cost effective during the replacement or upgrade of elements in the computer system 1. In the computer system 1, the processor 11 and the memory 12 are disposed on a single motherboard 10a, which may be a multilayer motherboard (or circuit board) mitigates signal interference/noise through various techniques (e.g., spacing, shielding, insulating layers). However, the cost of a multilayer motherboard increases with increasing number of layers within the board, which also negatively impacts yield.

Figure 2:
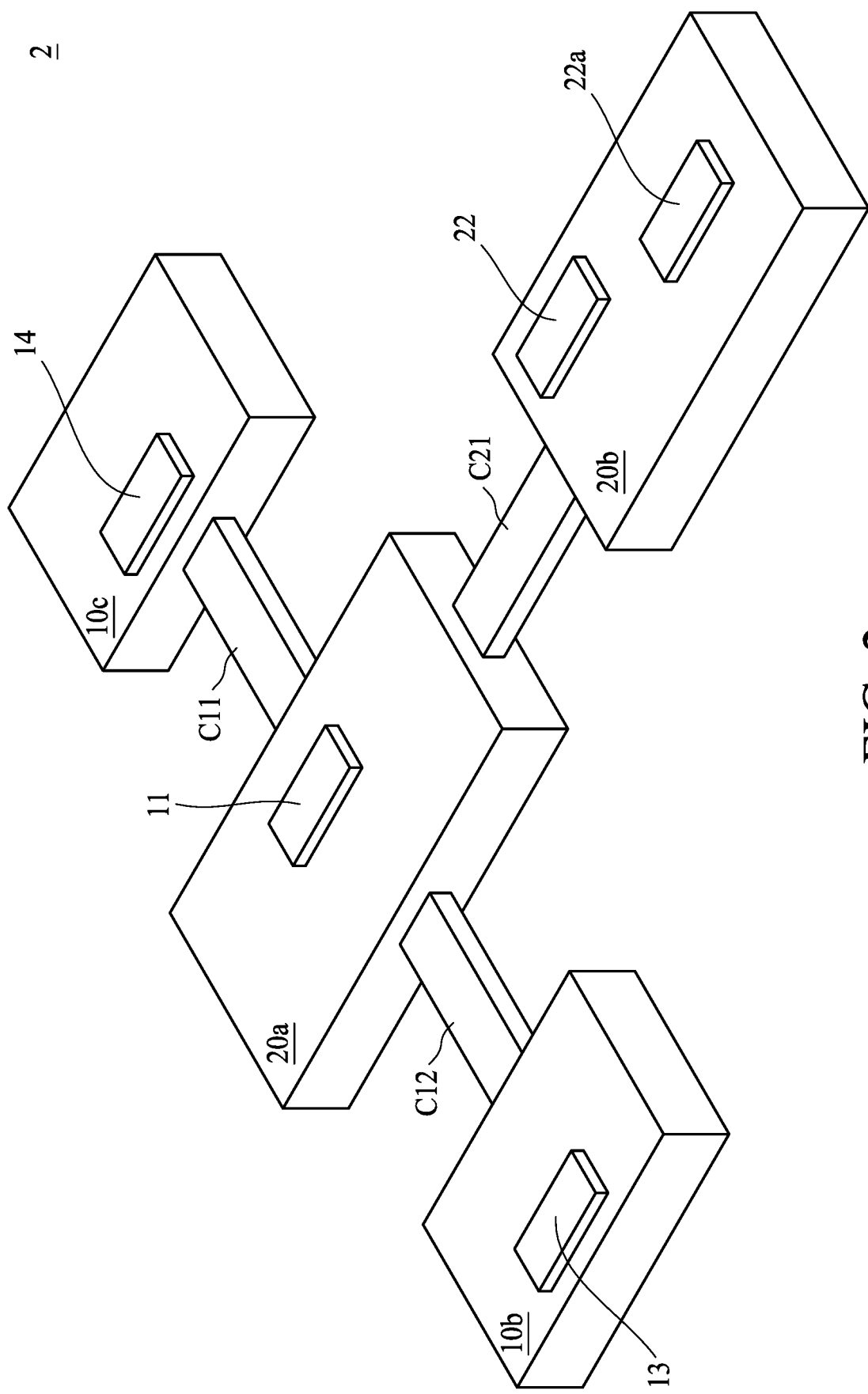
FIG. 2 illustrates a block diagram of a computer system in accordance with some embodiments of the present disclosure.

FIG. 2 illustrates a block diagram of a computer system 2 in accordance with some embodiments of the present disclosure. The computer system 2 is similar to the computer system 1 in FIG. 1 except that in the computer system 2, the processor 11 and the memory 22 are located on different motherboards (circuit boards). As shown in FIG. 2, the processor 11 is located on a motherboard 20a while the memory 22 and a controller 22a are located on a motherboard 20b which is separated from the motherboard 20a. In other words, the memory 22 is further disaggregated from the processor 11.

The memory 22 is located on the motherboard 20b and coupled to the processor 11 via high speed link (which might be enabled through a connector C21). In some embodiments, each of the motherboard 20a and the motherboard 20b includes a connector. The connector may be SATA connector, a micro SATA (mSATA) connector, a SATA2 connector a SATA3 connector, a SATA4 connector, a universal serial bus (USB) connector, a USB 3.0 connector, a SATAe connector, a Thunderbolt 3 connector, or a connector in accordance with JEDEC defined technical standard, such as the MO-297 standard and the MO-300 standard, a Next Generation Form Factor (NGFF) connector or an M.2 connector. The connector as envisioned could enable a technology for high speed communication not as yet conceived or in the nascent stages. Such technologies could include optical connections or other esoteric technologies.

In some embodiments, the memory 22 can communicate with the processor 11 via a point-to-point connection through a high speed serial connection, which may provide a packet-based signal transmission. Compared to the memory 12 in FIG. 1, which communicates with the processor 11 via MDB, the memory 22 using the point-to-point-connection allows data transmission between the processor 11 and the memory 22 at a higher speed. In some embodiments, to transmit data between the processor 11 and the memory 22 in such a relatively high speed, the data between the processor 11 and the memory 22 can be transmitted based on a differential signaling scheme. For the sake of this discussion, differential signaling switches the data above and below a reference voltage level (or multiple reference voltage levels). Compared with the memory 12 in FIG. 1, which may use the full-rail signaling scheme, the memory 22 using the differential signaling scheme provides a relatively high frequency signal transmission and/or consumes relatively less power. In addition, since the memory 22 and the processor 11 are disaggregated and located on separate motherboards (or circuit boards), transmission losses may occur due to the impedance mismatch between the motherboard 20a and the motherboard 20b. The impedance mismatch may be introduced due to the connectors and/or the processing of the motherboards during production (i.e., link production mismatch). The memory 22 using the differential signaling scheme could mitigate transmission losses by routing the signals to minimize the impact of these structures.

In some embodiments, the memory 22 may be a dual in-line memory module (DIMM) having one or more memory devices capable of plugging into a DIMM slot on the motherboard 20b. For example, the memory 22 may be or include DRAM, such as asynchronous dynamic random access memory, SDRAM, DDR SDRAM, DDR2 SDRAM, DDR3 SDRAM, DDR4 SDRAM, Hybrid Memory Cube (HMC) near-memory or any other suitable implementations including any other memory technologies such as Optane™, 3D XPoint™ etc. Memory bandwidth is a bottleneck to system performance in almost all computational systems, whether the systems are high-performance computing, high-end servers, graphics, and (very soon) mid-level computer systems. The conventional memory technologies (e.g., DDR) are not keeping pace with the increasing performance demands of the latest microprocessor roadmaps. By replacing the conventional memory with HMC (or other memory technologies), the bandwidth and power efficiency can be improved while the latency and the physical footprint can be reduced.

In some embodiments, the memory 22 can be coupled to a controller 22a via a parallel link or a high speed serial link. In some embodiments, there is a direct link between the memory 22 and the processor 11 for controlling the memory 22 (e.g., disabling the memory 22, invalidating the memory 22 and/or sending the memory to low power state). The parallel link may communicate data in parallel and the high speed serial link would be a link for serial data communication. The controller 22a may include partitioning logic for identifying addresses in the memory 22 where data is stored or from which the data is retrieved and communicated to the processor 11. In some embodiments, the controller 22a can be coupled to multiple processors, allowing the multiple processors to access different partitions of the memory 22, so that different processors 11 act as different logical entities sharing the memory 22.

In some embodiments, the computer system 2 may include circuitry (not shown in FIG. 2), such as serializer/deserializer (SerDes) circuitry, between the memory 22 and the controller 22a to convert parallel data to serial data, and vice versa. In some embodiments, such circuitry may be integrated into the memory 22 or the controller 22a. Alternatively, such circuitry can be an independent module connected between the memory 22 and the controller 22a.

In the computer system 2, the memory 22 is separated or disaggregated from the processor 11, which provides relatively more flexibility and relatively higher efficiency during upgrade operation or replacement of the element(s)/component(s). For example, in the computer system in FIG. 1, to change or upgrade the memory 12, the motherboard 10a and/or the processor 11 would be changed as well. Since the memory 22 is separate or disaggregated from the processor 11, the memory 22 can be individually changed or upgraded without changing the motherboard 10a and/or the processor 11. As mentioned above, memory is generally the bottleneck of computer systems performance. In other words, in a computer system, a processor is usually sufficient for a longer period of time in comparison with the memory. Therefore, the memory would be changed more frequently than the processor if the computer system performance has to be ungraded. In accordance with the embodiment in FIG. 2, by separating or disaggregating the memory 22 from the processor 11, the flexibility and efficiency for upgrading the computer system 2 can be improved.

Furthermore, a differential signaling scheme can be used to electrically connect the memory 22 (which is disposed on the motherboard 20b) to the processor 11 (which is disposed on the motherboard 20a) to mitigate signal interference/noise. In other words, compared with the full-rail signaling scheme, the use of the differential signaling scheme can minimize the number of the ground layers, which would reduce the cost and increase the yield of manufacturing the computer system 2.

Figure 3:
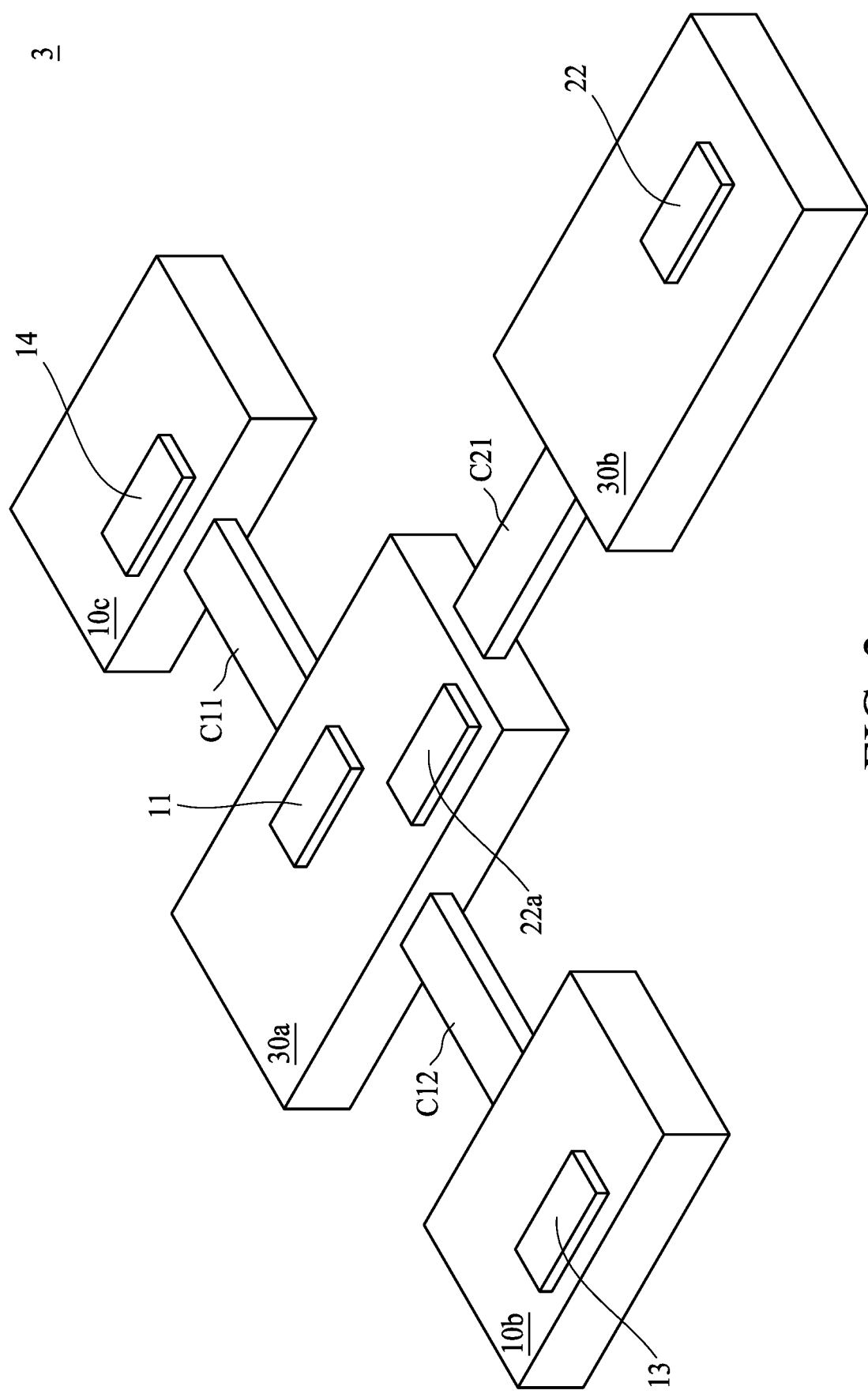
FIG. 3 illustrates a block diagram of a computer system in accordance with some embodiments of the present disclosure.

FIG. 3 illustrates a block diagram of a computer system 3 in accordance with some embodiments of the present disclosure. The computer system 3 is similar to the computer system 2 in FIG. 2 except that in FIG. 2, the controller 22a and the memory 22 are located at the same motherboard 22b while in FIG. 3, the controller 22a and the processor 11 are located on the same motherboard 30a. As shown in FIG. 3, the controller 22a and the processor 11 are located on the motherboard 30a and the memory 22 is located on the motherboard 30b. In some embodiments, the motherboard 30a and the motherboard 30b communicate with each other in a similar way to the communication between the motherboard 20a and the motherboard 20b in FIG. 2.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A computer system, comprising:
a processor located on a first circuit board having a first connector; and
a memory located on a second circuit board having a second connector, wherein
the first circuit board and the second circuit board are horizontally disaggregated from each other;
the first connector is connected to the second connector;
the processor and the memory are configured to communicate with each other based on a differential signaling scheme by switching data above and below a reference voltage level; and
wherein the first connector and the second connector are connected via a serial link, wherein the first connector and the second connector include at least one of the following: a SATA connector, a micro SATA (mSATA) connector, a SATA2 connector a SATA3 connector, a SATA4 connector, a USB connector, a USB 3.0 connector, a SATAe connector, a Thunderbolt 3 connector, a connector in accordance with JEDEC defined technical standard, a Next Generation Form Factor (NGFF) connector and an M.2 connector.

2. The computer system of claim 1, wherein the processor and the memory are configured to communicate with each other via a point-to-point connection.

3. The computer system of claim 1, further comprising an I/O Hub located on a third circuit board separate from the first circuit board and the second circuit board, wherein the I/O Hub is connected to the processor.

4. The computer system of claim 3, wherein the I/O Hub includes high speed communication links having at least one of the following: Peripheral Component Interconnect Express (PCI-E), Optane memory, Thunderbolt, Enhanced Serial Peripheral Interface (eSPI), SPI, Low Pin Count (LPC) Bus, System Management Bus (SMBus), High Definition Audio (HD Audio), Local Area Network Port Physical Layer (LAN PHY), Serial Advanced Technology Attachment (SATA) and Universal Serial Bus (USB).

5. The computer system of claim 1, further comprising a controller connected to the processor and the memory, wherein the controller is located on the first circuit board.

6. The computer system of claim 1, further comprising a controller connected to the processor and the memory, wherein the controller is located on the second circuit board which includes the memory.

7. The computer system of claim 1, wherein the memory includes double data rate synchronous dynamic random access memory (DDR SDRAM), double data rate type two SDRAM (DDR2 SDRAM), double data rate type three SDRAM (DDR3 SDRAM), double data rate type four SDRAM (DDR4 SDRAM) and Hybrid Memory Cube (HMC) near-memory.

8. The computer system of claim 1, further comprising serializer/deserializer (SerDes) circuitry connected to the memory.

9. A computer system, comprising:
a processor located on a first circuit board having a first connector; and
a memory located on a second circuit board having a second connector, wherein
the first circuit board is horizontally disaggregated from the second circuit board,
the first connector is connected to the second connector,
the processor and the memory communicate with each other via a serial connection based on a differential signaling scheme by switching data above and below a reference voltage level; and
wherein the first connector and the second connector are connected via a serial link, wherein the first connector and the second connector include at least one of the following: a SATA connector, a micro SATA (mSATA) connector, a SATA2 connector a SATA3 connector, a SATA4 connector, a USB connector, a USB 3.0 connector, a SATAe connector, a Thunderbolt 3 connector, a connector in accordance with JEDEC defined technical standard, a Next Generation Form Factor (NGFF) connector and an M.2 connector.

10. The computer system of claim 9, further comprising an I/O Hub located on a third circuit board separate from the first circuit board and the second circuit board, wherein the I/O Hub is connected to the processor.

11. The computer system of claim 10, wherein the I/O Hub includes at least one the following: Peripheral Component Interconnect Express (PCI-E), Optane memory, Thunderbolt, Enhanced Serial Peripheral Interface (eSPI), SPI, Low Pin Count (LPC) Bus, System Management Bus (SMBus), High-Definition Audio (HD Audio), Local Area Network Port Physical Layer (LAN PHY), Serial Advanced Technology Attachment (SATA) and Universal Serial Bus (USB).

12. The computer system of claim 9, further comprising a controller connected to the processor and the memory, wherein the controller is located on the first circuit board.

13. The computer system of claim 9, further comprising a controller connected to the processor and the memory, wherein the controller is located on the second circuit board.

14. The computer system of claim 9, wherein the memory includes double data rate synchronous dynamic random access memory (DDR SDRAM), double data rate type two SDRAM (DDR2 SDRAM), double data rate type three SDRAM (DDR3 SDRAM), double data rate type four SDRAM (DDR4 SDRAM) and Hybrid Memory Cube (HMC) near-memory.

15. The computer system of claim 9, further comprising serializer/deserializer (SerDes) circuitry connecting the processor to the memory.

* * * * *